United States Patent
Nakamura et al.

(10) Patent No.: US 9,209,424 B2
(45) Date of Patent: Dec. 8, 2015

(54) LAMINATED SUBSTRATE FOR ORGANIC LED ELEMENT, AND ORGANIC LED ELEMENT

(71) Applicant: ASAHI GLASS COMPANY, LIMITED, Chiyoda-ku (JP)

(72) Inventors: Nobuhiro Nakamura, Tokyo (JP); Naoya Wada, Tokyo (JP); Masamichi Tanida, Tokyo (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 14/250,726

(22) Filed: Apr. 11, 2014

(65) Prior Publication Data
US 2014/0217390 A1 Aug. 7, 2014

Related U.S. Application Data

(63) Continuation of application No. PCT/JP2012/077522, filed on Oct. 24, 2012.

(30) Foreign Application Priority Data

Oct. 28, 2011 (JP) .................. 2011-236987

(51) Int. Cl.
  *H01L 51/56* (2006.01)
  *H01L 51/52* (2006.01)
  *G02B 5/02* (2006.01)
  *H01L 51/00* (2006.01)

(52) U.S. Cl.
  CPC .......... *H01L 51/5268* (2013.01); *G02B 5/0242* (2013.01); *G02B 5/0278* (2013.01); *H01L 51/0096* (2013.01); *Y02E 10/549* (2013.01); *Y10T 428/265* (2015.01)

(58) Field of Classification Search
  CPC ............ H01L 51/0096; H01L 51/5215; H01L 51/5268; H01L 51/5275; H01L 51/56
  See application file for complete search history.

(56) References Cited

U.S. PATENT DOCUMENTS

| | | | |
|---|---|---|---|
| 8,018,140 B2 | 9/2011 | Nakamura et al. | |
| 8,427,045 B2 | 4/2013 | Nakamura et al. | |
| 2010/0187987 A1 | 7/2010 | Nakamura | |
| 2010/0230667 A1* | 9/2010 | Nakamura et al. | 257/40 |
| 2011/0001159 A1 | 1/2011 | Nakamura et al. | |

FOREIGN PATENT DOCUMENTS

| | | |
|---|---|---|
| WO | 2009/116531 | 9/2009 |
| WO | 2011/046156 | 4/2011 |
| WO | 2011/126097 | 10/2011 |

OTHER PUBLICATIONS

International Search Report issued Jan. 22, 2013 in PCT/JP2012/077522 filed Oct. 24, 2012.

* cited by examiner

*Primary Examiner* — Kyoung Lee
(74) *Attorney, Agent, or Firm* — Oblon, McClelland, Maier & Neustadt, L.L.P.

(57) ABSTRACT

A laminated substrate for an organic LED element includes a translucent substrate, a scattering layer including glass and a solid scattering material provided on the translucent substrate and having a thickness of 30 μm or less, and an electrode provided on the scattering layer, and no covering layer including glass is provided between the scattering layer and the electrode.

10 Claims, 1 Drawing Sheet

LAMINATED SUBSTRATE FOR ORGANIC LED ELEMENT, AND ORGANIC LED ELEMENT

CROSS-REFERENCE TO RELATED APPLICATIONS

This application is a continuation application filed under 35 U.S.C. 111(a) claiming the benefit under 35 U.S.C. 120 and 365(c) of a PCT International Application No. PCT/JP2012/077522 filed on Oct. 24, 2012 and designated the U.S., which is based upon and claims the benefit of priority of Japanese Patent Application No. 2011-236987 filed on Oct. 28, 2011, the entire contents of which are incorporated herein by reference.

BACKGROUND OF THE INVENTION

1. Field of the Invention

The present invention relates to a laminated substrate for the organic LED element, and an organic LED element.

2. Description of the Related Art

For example, International Publication No. 2009/116531 proposes improving a light extraction efficiency of an organic LED element by providing a scattering layer and a covering layer between a substrate and an electrode, where the scattering layer includes glass and a scattering material, and the covering layer is provided on the scattering layer to cover the scattering material included in the scattering layer and projecting from a glass surface of the scattering layer.

However, a glass composition of the scattering layer of the International Publication No. 2009/116531 includes a large amount of $SiO_2$ with respect to $Bi_2O_3$ as indicated in Table 2 of the International Publication No. 2009/116531, and a value of $SiO_2/Bi_2O_3$ exceeds 1.1. Hence, when the scattering material (hereinafter also referred to as "scattering material") includes a filler having an average particle diameter of 100 nm to 900 nm, the filler may be exposed at the surface of the scattering layer. The exposed filler includes sharp concavo-convex shapes, and may cause a short-circuit between the electrodes when the organic LED is formed on the scattering layer. For this reason, it is necessary to provide the covering layer including glass, between the scattering layer and the electrode, in order to suppress short-circuiting.

SUMMARY OF THE INVENTION

The present invention is conceived in view of the above described problem, and one object is to provide a laminated substrate for the organic LED element, and an organic LED element, that can suppress exposure of a filler at a surface of a scattering layer in a case in which a solid scattering material (filler) is used, and does not require a covering layer including glass to be provided between the scattering layer and electrode.

In order to achieve the above object, a laminated substrate for an organic LED element in one embodiment of the present invention includes
  a translucent substrate;
  a scattering layer, including glass and a solid scattering material, provided on the translucent substrate and having a thickness of 30 μm or less; and
  an electrode provided on the scattering layer,
  wherein no covering layer including glass is provided between the scattering layer and the electrode.

An organic LED element in another embodiment of the present invention includes
  a translucent substrate;
  a scattering layer, including glass and a solid scattering material, provided on the translucent substrate and having a thickness of 30 μm or less;
  a first electrode provided on the scattering layer;
  an organic layer provided on the first electrode; and
  a second electrode provided on the organic layer,
  wherein no covering layer including glass is provided between the scattering layer and the first electrode.

A laminated substrate for an organic LED element in another embodiment of the present invention includes
  a translucent substrate;
  a scattering layer, including glass and a solid scattering material, provided on the translucent substrate and having a thickness of 30 μm or less; and
  an electrode provided on the scattering layer,
  wherein the glass of the scattering layer includes, as represented by mol percentage based on the following oxides, 15% to 60% of $B_2O_3$, 5% to 50% of $ZnO$, 5% to 37% of $Bi_2O_3$, 0 to 21% of $SiO_2$, 0 to 15% of $Al_2O_3$, a total of 0 to 20% of alkaline earth metal oxides, includes substantially no alkali metal oxide, and $SiO_2/Bi_2O_3$ (value obtained by dividing $SiO_2$-content by $Bi_2O_3$-content) is less than 1.1,
  wherein an average particle diameter of the solid scattering material is 100 nm to 900 nm, and
  wherein no covering layer including glass is provided between the scattering layer and the first electrode.

In the laminated substrate for the organic LED element in another embodiment, the solid scattering material may be one of silica, alumina, titania, and zirconia.

DESCRIPTION OF THE PREFERRED EMBODIMENTS

A description will hereinafter be given of embodiments of the present invention with reference to the drawings. The following embodiments are examples, and various variations and modifications may be made without departing from the object of the present invention.

Figure 1:
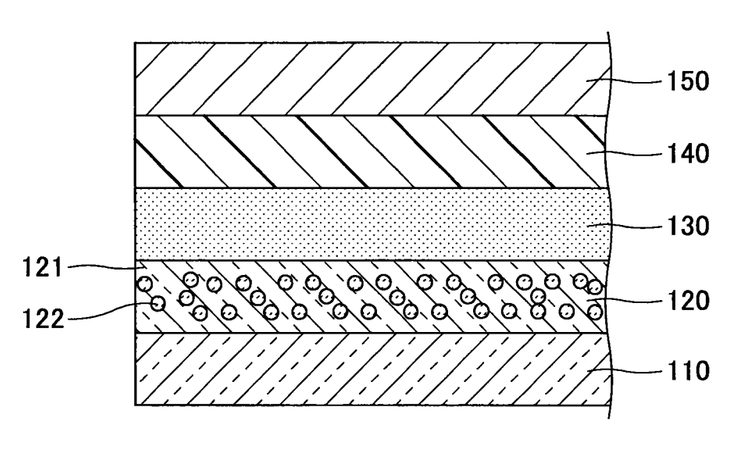
FIG. 1 is a cross sectional view illustrating an organic LED element in an embodiment of the present invention.

FIG. 1 is a cross sectional view illustrating an organic LED element in an embodiment of the present invention.

As illustrated in FIG. 1, the organic LED element is a bottom emission type organic LED, for example, and includes a translucent substrate 110, a scattering layer 120, a first electrode 130, an organic layer 140, and a second electrode 150 in this order. The first electrode 130 is an anode to supply holes to the organic layer 140, and may be a transparent electrode that transmits light emitted from the organic layer 140 towards the scattering layer 120. The second electrode 150 is a cathode to supply electrons to the organic layer 140, and may be a reflecting electrode that reflects the light emitted from the organic layer 140 towards the organic layer 140.

In this embodiment, the first electrode 130 is the anode and the second electrode 150 is the cathode, however, the first electrode 130 may be the cathode and the second electrode 150 may be the anode.

(Translucent Substrate)

The translucent substrate 110 is made of a material having a high transmittance with respect to visible light. For example, the translucent substrate 110 may be a glass substrate or a plastic substrate, however, because the plastic substrate may become deformed at the time of sintering glass frits, it is preferable to use the glass substrate.

The glass used for the glass substrate may be alkali glass, borosilicate glass, fused silica, and the like. Generally, alkali silicate glass such as soda-lime glass is used. A general alkali silicate glass substrate has an average linear thermal expansion coefficient at 50° C. to 300° C. (hereinafter simply referred to as "average linear thermal expansion coefficient") of approximately $83 \times 10^{-7}$/° C., and an annealing temperature of approximately 550° C. to approximately 630° C. Because the glass substrate may become deformed when subjected to a heat treatment at a temperature higher than or equal to the annealing temperature, it is preferable to form the scattering layer 120 at a temperature lower than the annealing temperature.

The plastic substrate has a low moisture resistance compared to the glass substrate, and may thus be configured to include a barrier. For example, a glass layer may be formed on a surface of the plastic substrate, opposite to the surface provided with the scattering layer 120.

The translucent substrate 110 has a thickness of 0.1 mm to 2.0 mm, for example.

The scattering layer 120 is formed on the translucent substrate 110, and a laminated substrate is formed by the translucent substrate 110, the scattering layer 120, and the like. A scattering layer forming surface of the glass substrate forming the translucent substrate 110 may be subjected to a surface treatment such as silica coating and the like. In other words, a protection layer formed by a silica layer and the like may be formed between the glass substrate forming the translucent substrate 110 and the scattering layer 120. Details of the scattering layer 120 will be described later. The first electrode 130 is formed on the scattering layer 120.

(First Electrode)

The first electrode 130 is the anode to supply the holes to the organic layer 140, and forms the transparent electrode that transmits the light emitted from the organic layer 140 towards the scattering layer 120. The first electrode 130 is formed by a material having a high work function and a high transmittance (for example, a transmittance of 80% or higher).

Materials used for the first electrode 130 include ITO (Indium Tin Oxide), $SnO_2$, ZnO, IZO (Indium Zinc Oxide), AZO (ZnO—$Al_2O_3$: aluminum-doped zinc oxide), GZO (ZnO—$Ga_2O_3$: gallium-doped zinc oxide), N-doped $TiO_2$, Ta-doped $TiO_2$, and the like.

The first electrode 130 has a thickness of 50 nm or greater, for example. The electrical resistance becomes high when the thickness of the first electrode 130 is less than 50 nm.

The first electrode 130 has a refractive index of 1.7 to 2.2, for example. A carrier concentration of ITO may be increased in order to reduce the refractive index of the ITO forming the first electrode 130. The higher the Sn concentration of ITO, the lower the refractive index of the ITO. However, as the Sn concentration increases, mobility and transmittance decrease, and the Sn concentration is set to balance the mobility and transmittance.

In this specification, "refractive index" refers to the refractive index that is measured at 25° C. using d-line (wavelength: 587.6 nm) of a He lamp, unless otherwise indicated.

The first electrode 130 may be made up of a single layer or made up of a plurality of layers. In addition, an auxiliary wiring may be formed to make contact with the first electrode 130 at a part above the first electrode or at a part under the first electrode 130. Materials used for the auxiliary wiring may include metals such as Au, Ag, Cu, Al, Cr, Mo, Pt, W, Ni, Ru, and the like, metal compounds, and the like.

The organic layer 140 is formed on the first electrode 130.

(Organic Layer)

The organic layer 140 may have a general configuration including at least an emissive layer, and may include a hole injecting layer, a hole transport layer, an electron transport layer, and an electron injecting layer if necessary. For example, the organic layer 140 includes, from the anode side, the hole injecting layer, the hole transport layer, the emissive layer, the electron transport layer, and the electron injecting layer in this order.

The hole injecting layer is formed by a material having a small ionization potential difference with respect to the anode. Polyethylene dioxythiophene (PEDOT:PSS) and the like, doped with polystyrene sulfonic acid (PSS), are used as the high-molecular-weight material. Phthalocyanenes such as copper phthalocyanene (CuPc) and the like are used as the low-molecular-weight material.

The hole transport layer transports the holes injected from the hole injecting layer to the emissive layer. Materials used for the hole transport layer include a triphenylamine derivative, N,N'-Bis(1-naphthyl)-N,N'-Diphenyl-1,1'-biphenyl-4,4'-diamine (NPD), N,N'-Diphenyl-N,N'-Bis[N-phenyl-N-(2-naphtyl)-4'-aminobiphenyl-4-yl]-1,1'-biphenyl-4,4'-diamine (NPTE), 1,1'-bis[(di-4-tolylamino)phenyl]cyclohexane (HTM2), and N,N'-Diphenyl-N,N'-Bis(3-methylphenyl)-1,1'-diphenyl-4,4'-diamine (TPD), and the like, for example. The hole transport layer preferably has a thickness of 10 nm to 150 nm. The thinner the hole transport layer, the lower the voltage, however, the thickness of the hole transport layer is preferably 10 nm to 150 nm in view of the problem of the electrodes that may become short-circuited.

The emissive layer emits light using energy that is generated by recombination of the holes and the electrons injected from the anode and the cathode. Doping of emissive dye to a host material forming the emissive layer enables a high emission efficiency to be obtained, and also converts an emission wavelength. Organic materials used for the emission layer include low-molecular weight materials and high-molecular-weight materials. In addition, the organic materials are categorized into fluorescent materials and phosphorescent materials depending on the emission mechanism. The organic materials forming the emissive layer include, for example, a metal complex of quinoline derivative, such as tris(8-quinolinolate) aluminum complex ($Alq_3$), bis(8-hydroxy) quinaldine aluminum phenoxide (Alq'2OPh), bis(8-hydroxy) quinaldine aluminum-2,5-dimethylphenoxide (BAlq), mono (2,2,6,6-tetramethyl-3,5-heptanedionate)lithium complex (Liq), mono(8-quinolinolate)sodium complex (Naq), mono (2,2,6,6-tetramethyl-3,5-heptanedionate) lithium complex, mono(2,2,6,6-tetramethyl-3,5-heptanedionate) sodium complex, bis(8-quinolinolate) calcium complex ($Caq_2$), and the like, or a fluorescent substance, such as tetraphenylbutadiene, phenylquinacridone (QD), anthracene, perylene, coronene, and the like. The host material is preferably a quinolinolate complex, and an aluminum complex having 8-quinolinol and a derivative thereof as a ligand is particular preferable.

The electron transport layer transports the electrons injected from the electrode. Materials used for the electron transport layer include, for example, a quinolinol aluminum complex ($Alq_3$), an oxadiazole derivative (for example, 2,5-bis(1-naphthyl)-1,3,4-oxadiazole (END), 2-(4-t-butylphenyl)-5-(4-biphenyl)-1,3,4-oxadiazole (PBD) and the like), a triazole derivative, a bathophenanthroline derivative, a silole derivative, and the like.

The electron injecting layer may be a layer doped with an alkali metal such as lithium (Li), cesium (Cs), and the like to the cathode surface, for example.

The second electrode 150 is formed on the organic layer 140.

(Second Electrode)

The second electrode 150 is the cathode to supply the electrons to the organic layer 140, and forms the reflecting electrode that reflects the light emitted from the organic layer 140 towards the organic layer 140. The second electrode 150 is formed by a metal having a small work function, or an alloy of such a metal.

Materials used for the second electrode 150 include alkali metals, alkaline earth metals, metals in group 3 of the periodic table, and the like, for example. Aluminum (Al), magnesium (Mg), silver (Ag), alloys of such metals, and the like may be used for such materials.

For example, the second electrode 150 may be a codeposited layer of MgAg, a laminated electrode having Al deposited on a thin film deposition of LiF or $Li_2O$, or an electrode having aluminum (Al) stacked on a layer of alkaline earth metal (for example, Ca or Ba).

(Scattering Layer)

The scattering layer 120 is provided between the translucent substrate 110 and the first electrode 130. Generally, the refractive index of the translucent substrate 110 is lower than the refractive index of the first electrode 130, and in a state in which no scattering layer 120 is provided, total reflection occurs and there exists a large portion of the light that cannot be extracted to the outside. The scattering layer 120 changes propagating directions of such light by scattering, in order to increase the light extraction efficiency with which the light can be extracted to the outside.

As illustrated in FIG. 1, the scattering layer 120 includes a scattering material 122 having a refractive index different from that of glass, dispersed within a base material 121 made of glass. The scattering layer 120 is formed by sintering a raw material (for example, paste) including the glass. The raw material may include the scattering material 122.

The refractive index of the base material 121 at a predetermined wavelength is preferably higher than or equal to the refractive index of the first electrode 130. In this case, the light extraction efficiency with which the light is extracted to the outside is improved, because total reflection of light having the predetermined wavelength does not occur at an interface between the first electrode 130 and the scattering layer 120. The predetermined wavelength may be at least a part (for example, red, blue, or green) of a wavelength range of the light emitted from the organic layer 140, and is preferably the entire region (430 nm to 650 nm) of the wavelength range of the emitted light, and more preferably the entire region (360 nm to 830 nm) of the wavelength range of visible light.

A difference between the refractive index of the base material 121 and the refractive index of the scattering material 122 is preferably 0.05 or greater at the predetermined wavelength described above.

A surface roughness Ra of the scattering layer 120 is preferably 100 nm or less, more preferably 90 nm or less, and further preferably 80 nm or less. When the surface roughness Ra of the scattering layer 120 exceeds 100 nm, the short-circuiting of the first electrode 130 and the second electrode 150 formed on the surface of the scattering layer 120 may occur, and a leak current may be generated. The surface roughness Ra is a microscopically observed surface roughness having a value that is obtained by eliminating a long-wavelength component by setting a cutoff value $\lambda c$ of a profile filter prescribed by JIS B 0601-2001 to 2.5 mm, and can be measured by an atomic force microscope (AFM) and the like, for example.

(Scattering Material)

The scattering material 122 has a refractive index different from that of the base material 121. A Solid particles (filler), more particularly, ceramic particles having low reaction with the base material 121, and shapes, dimensions, and contents thereof that are easily controllable, are used for the scattering material 122. The ceramic particles may be formed by silica ($SiO_2$), alumina ($Al_2O_3$), titania ($TiO_2$), zirconia ($ZrO_2$), and the like, for example. A plurality of kinds of ceramic particles may be used. Zirconia ($ZrO_2$) has a particularly good wettability with respect to the base material 121 at the time of the sintering, and can easily form a smooth surface, and thus, it is particularly preferable to use zirconia ($ZrO_2$) as the scattering material 122. Yttria-stabilized zirconia may be used for the zirconia ($ZrO_2$).

Besides the ceramic particles, glass having a composition different from that of the glass used for the base material 121, may be used for the scattering material 122.

A ratio of the scattering material 122 occupying the scattering layer 120 is appropriately set depending on the kind of the scattering material 122 used. In the case in which the ceramic particles are used for the scattering material 122, the ratio described above is preferably 1 volume % to 10 volume %. When the ratio described above is less than 1 volume %, sufficient scattering cannot be obtained in order to extract the light from the organic LED. On the other hand, when the ratio described above exceeds 10 volume %, the ceramic particles project from the surface of the sintered layer, and there is a possibility of increasing the short-circuit or the leak current of the organic LED.

In a case in which a plurality of kinds of scattering materials 122 are dispersed within the scattering layer 120, "the ratio of the scattering material 122 occupying the scattering layer 120" refers to a total of the ratios of all of the scattering materials 122.

The dimensions and shapes of the scattering material 122 are appropriately set depending on the kind of the scattering material 122. An average particle diameter (D50) of the filler used for the scattering material 122 is preferably 0.05 µm to 1 µm, and more preferably 100 nm to 900 nm. When D50 is less than 0.05 µm, sufficient scattering cannot be obtained in order to extract the light from the organic LED, and because a wavelength dependency of the scattering intensity increases to make it difficult to control the scattering intensity, it becomes difficult to control the tone of color of the light that is extracted. On the other hand, when D50 is greater than 1 µm, sufficient scattering cannot be obtained in order to extract the light from the organic LED. D50 is the 50% diameter prescribed by JIS R 1629-1997. In a case in which the filler having an average particle diameter of 100 nm to 900 nm is used for the scattering material 122, the scattering material 122 makes contact with the base material 121 over a large surface area, and the scattering material may become exposed at the surface of the scattering layer when fluidity deteriorates during a sintering process of the scattering layer. For this reason, it is preferable to appropriately select the composition of the base material 121.

In a case in which the ceramic particles are used, the refractive index of the scattering material 122 is preferably 1.8 or lower, or 2.1 or higher. When the refractive index of the ceramics is higher than 1.8 and lower than 2.1, sufficient extraction of light cannot be expected.

(Base Material)

The glass (hereinafter referred to as "base material glass") forming the base material 121 is manufactured by mixing a plurality of kinds of glass raw materials at predetermined ratios, heating and melting the mixture, and thereafter cooling the mixture. The base material glass that is manufactured is broken into pieces by a mill, and classified if necessary, in order to obtain glass in powder form (glass frits). The glass frits are sintered in order to form the base material 121.

The base material glass preferably includes, as represented by mol percentage based on the following oxides, 15% to 60% of $B_2O_3$, 5% to 50% of ZnO, 5% to 37% of $Bi_2O_3$, 0 to 21% of $SiO_2$, and 0 to 20% of $P_2O_5$, 0 to 15% of $Al_2O_3$, 0 to 5% of $ZrO_2$, 0 to 10% of $Gd_2O_3$, 0 to 10% of $TiO_2$, and a total of 0 to 20% of alkaline earth metal oxides, $SiO_2/Bi_2O_3$ (value obtained by dividing $SiO_2$-content by $Bi_2O_3$-content) is less than 1.1, $P_2O_5/ZnO$ (a value obtained by dividing $P_2O_5$-content by ZnO-content) is less than 0.48, and includes substantially no alkali metal oxide.

According to the glass composition described above, the average linear thermal expansion coefficient is small (difference from the average linear thermal expansion coefficient of an alkali silicate glass substrate is small), the refractive index is high, the glass-transition temperature is low, and the crystallization of glass at the time of sintering the glass frits can be suppressed. In addition, exposure of the filler at the surface of the scattering layer can be suppressed in a case in which the solid scattering material (filler) is used, and it is unnecessary to provide a covering layer including glass, between the scattering layer and the electrode. Each component will be described in the following. In the description of each component, "%" refers to mol %.

$B_2O_3$ is a component that forms the framework of the glass. The $B_2O_3$-content of the base material glass is 15% to 60%. When the $B_2O_3$-content of the base material glass is less than 15%, devitrification of the glass easily occurs at the time of the manufacture, and in addition, the glass easily crystallizes at the time of sintering the glass frits. On the other hand, when the $B_2O_3$-content of the base material glass exceeds 60%, the glass-transition temperature becomes high. In addition, when the $B_2O_3$-content of the base material glass exceeds 60%, the refractive index decreases and is thus not preferable. The $B_2O_3$-content of the base material glass is preferably 20% to 55%, more preferably 25% to 50%, and further preferably 36% to 43%.

ZnO is a component that stabilizes the glass. The ZnO-content of the base material glass is 5% to 50%. When the ZnO-content of the base material glass is less than 5%, the glass-transition temperature becomes high, and the average linear thermal expansion coefficient becomes large. On the other hand, when ZnO-content of the base material glass exceeds 50%, devitrification of the glass easily occurs at the time of the manufacture, and in addition, the glass easily crystallizes at the time of sintering the glass frits. In addition, when ZnO-content of the base material glass exceeds 50%, the weather resistance of the glass may deteriorate. The ZnO-content of the base material glass is preferably 20% to 45%, more preferably 25% to 40%, and further preferably 30% to 37%.

$Bi_2O_3$ is a component that increases the refractive index and lowers the glass-transition temperature. The $Bi_2O_3$-content of the base material glass is 5% to 37%. When the $Bi_2O_3$-content of the base material glass is less than 5%, the refractive index becomes low, and the glass-transition temperature becomes high. On the other hand, when the $Bi_2O_3$-content of the base material glass exceeds 37%, the average linear thermal expansion coefficient becomes large, and the glass easily crystallizes at the time of sintering the glass frits. The $Bi_2O_3$-content of the base material glass is preferably 10% to 30%, more preferably 15% to 25%, and further preferably 17% to 23%.

$SiO_2$ is a component that increases the stability of the glass and suppresses the crystallization at the time of sintering the glass frits. The $SiO_2$-content of the base material glass is 0 to 21%. When the $SiO_2$-content of the base material glass exceeds 21%, the dissolving temperature of the glass raw material becomes high, and deterioration and the like of a melter occurs, to thereby make it difficult to manufacture the glass. The $SiO_2$-content of the base material glass is preferably 1% to 17%, more preferably 2% to 14%, and further preferably 2% to 11%.

$P_2O_5$ is an arbitrary component that suppresses crystallization at the time of sintering the glass frits. The $P_2O_5$-content of the base material glass is 0 to 20%. When the $P_2O_5$-content of the base material glass exceeds 20%, the glass-transition temperature becomes high, and the average linear thermal expansion coefficient becomes large. In addition, when the $P_2O_5$-content of the base material glass exceeds 20%, the refractive index decreases. Because the effect of $P_2O_5$ on the glass-transition temperature is large, it is preferable to include substantially no $P_2O_5$ except for cases in which $P_2O_5$ is included as an impurity. The $P_2O_5$-content of the base material glass is preferably 0 to 10%, more preferably 0 to 5%, and further preferably 0 to 2%.

$Al_2O_3$ is an arbitrary component that increases the stability of glass. The $Al_2O_3$-content of the base material glass is preferably 0 to 15%. When the $Al_2O_3$-content of the base material glass exceeds 15%, devitrification of the glass easily occurs at the time of the manufacture, and in addition, the glass easily crystallizes at the time of sintering the glass frits. The $Al_2O_3$-content of the base material glass is preferably 0 to 12%, more preferably 0 to 10%, and further preferably 0 to 7%.

$ZrO_2$ is an arbitrary component that suppresses crystallization at the time of sintering the glass frits. The $ZrO_2$-content of the base material glass is preferably 0 to 7%, and more preferably 0 to 5%. When the $ZrO_2$-content of the base material glass exceeds 7%, devitrification of the glass easily occurs at the time of the manufacture, and the glass-transition temperature may become high. The $ZrO_2$-content of the base material glass is most preferably 0 to 3%.

$Gd_2O_3$ is an arbitrary component that increases the refractive index while suppressing the average linear thermal expansion coefficient to a low value, and also suppresses crystallization at the time of sintering the glass frits. The $Gd_2O_3$-content of the base material glass is 0 to 10%. When the $Gd_2O_3$-content of the base material glass exceeds 10%, crystallization of the glass may easily occur at the time of sintering the glass frits. The $Gd_2O_3$-content of the base material glass is may be 0 to 5%.

$TiO_2$ is a component that is not essential but increases the refractive index of the base material glass, and the $TiO_2$-content of the base material glass may be up to 10%. However, when the base material glass includes an excessive amount of $TiO_2$, crystallization of the glass may easily occur at the time of sintering the glass frits. The $TiO_2$-content of the base material glass may be 0 to 5%. The $TiO_2$-content of the base material glass is preferably 0 to 3%.

$WO_3$ is a component that is not essential but increases the refractive index of the base material glass, and the $WO_3$-content of the base material glass may be up to 5%. However, when the base material glass includes an excessive amount of $WO_3$, crystallization of the glass may easily occur at the time of sintering the glass frits. The $WO_3$-content of the base material glass is preferably 0 to 2%.

Alkaline earth metal oxides (MgO, CaO, SrO, and BaO) are arbitrary components that decrease the glass-transition temperature. The total content of the alkaline earth metal oxides in the base material glass is 0 to 20%, preferably 0 to 13%, and more preferably 0 to 10%. When the total content of the alkaline earth metal oxides in the base material glass exceeds 20%, the average linear thermal expansion coefficient becomes large, and crystallization of the glass may easily occur at the time of sintering the glass frits. The total content of the alkaline earth metal oxides in the base material glass may be 0 to 5%.

Substantially no $Li_2O$, $Na_2O$, and $K_2O$ are included in the base material glass, except for cases in which $Li_2O$, $Na_2O$, and $K_2O$ are included as impurities. When these alkaline metal oxides are included in the base material glass, alkali metal ions may scatter during a heat treatment process. The alkali metal ions may cause undesirable effects on the electrical operation of the organic LED element.

$SiO_2/Bi_2O_3$ (value obtained by dividing $SiO_2$-content by $Bi_2O_3$-content) is less than 1.1. When $SiO_2/Bi_2O_3$ is 1.1 or greater, fluidity deteriorates during the sintering process of the scattering layer, and if a filler having an average particle diameter of 100 nm to 900 nm is included as the scattering material, the filler may become exposed at the surface of the scattering layer. This exposure of the filler is caused by $SiO_2$ that has the effect of reducing the wettability of the base material glass and the filler, to interfere with the filler entering into the scattering layer. In addition, this exposure of the filler is also caused by $Bi_2O_3$ that considerably reduces the viscosity of glass during the sintering process when the base material glass and the filler are mixed, to promote entering of the filler into the scattering layer. $SiO_2/Bi_2O_3$ is preferably less than 0.8, and more preferably less than 0.5. $P_2O_5/ZnO$ (a value obtained by dividing $P_2O_5$-content by ZnO-content) is less than 0.48. When $P_2O_5/ZnO$ is 0.48 or greater, crystallization of the glass may easily occur at the time of sintering the glass frits.

Substantially no PbO and $Pb_3O_4$ are included in the base material glass, except for cases in which PbO and $Pb_3O_4$ are included as impurities. Hence, it is possible to satisfy the needs of the user who wishes to avoid the use of lead.

The base material glass may include, within a range in which the effects of the invention are obtainable, $GeO_2$, $Nb_2O_5$, $Y_2O_3$, $Ce_2O_3$, $CeO_2$, $La_2O_3$, $TeO_2$, SnO, $SnO_2$, $Sb_2O_3$, $Ta_2O_5$, and the like, for example, which amount to a total of 5% or less. In addition, the base material glass may include a small amount of coloring agent in order to adjust the tone of color. Known coloring agents, such as transition metal oxides, rare earth metal oxides, metal colloids, and the like, may be used as the coloring agent. These coloring agents may be used independently or in combination.

A refractive index $n_d$ of the base material glass is preferably 1.80 or higher, more preferably 1.85 or higher, and further preferably 1.90 or higher. When the refractive index $n_d$ is lower than 1.8, the effect of the total reflection at the interface between the scattering layer 120 and the first electrode 130 is large, and the light extraction efficiency may easily deteriorate.

A glass transition temperature Tg of the base material glass is preferably 495° C. or lower, more preferably 475° C. or lower, and further preferably 465° C. or lower. When the glass transition temperature Tg is 495° C. or lower, the glass may easily flow at the time of sintering the glass frits in a case in which the sintering of the glass frits is performed at a temperature lower than or equal to the annealing temperature of the glass substrate forming the translucent substrate 110.

An average linear thermal expansion coefficient α of the base material glass at 50° C. to 300° C. is preferably $60\times10^{-7}$/° C. to $100\times10^{-7}$/° C., and more preferably $70\times10^{-7}$/° C. to $90\times10^{-7}$/° C. When the average linear thermal expansion coefficient α is within a range of $60\times10^{-7}$/° C. to $100\times10^{-7}$/° C., a difference (absolute value) from the average linear thermal expansion coefficient of the glass substrate forming the translucent substrate 110 is small, and damage and warp to the substrate with respect to temperature changes can be reduced.

(Thickness of Scattering Layer)

The thickness of the scattering layer 120 is 30 μm or less. When the thickness of the scattering layer 120 exceeds 30 μm, the translucent substrate may become warped when the sintering is performed in a state in which the scattering layer is provided on the translucent substrate. The thickness of the scattering layer 120 is preferably 20 μm or less, more preferably 15 μm or less, and further preferably 10 μm or less.

(Method of Manufacturing Scattering Layer)

The scattering layer 120 is formed by coating the raw material (for example, paste) including the glass frits on the translucent substrate 110 and sintering this raw material. The raw material may include the scattering material 122.

(1) Glass Frits

The glass frits are powders of the base material glass. D50 of the base material glass powder is preferably 10 nm to 10 μm from the standpoint of coating ease. Surface modification of the base material glass powder may be made using a surfactant or a silane coupling agent.

(2) Paste

The paste is made by mixing the ceramic particles of the scattering material 122 and vehicle, in addition to the glass frits. The coating ease onto the translucent substrate 110 is improved by mixing the vehicle.

The paste is obtained by mixing the glass frits, the ceramic particles, and the vehicle in a planetary mixer and the like, and uniformly dispersing the paste by a triple roll mill and the like. A solvent and the like may be added and further mixed in the mixer, in order to adjust the viscosity. The paste is obtained by mixing a total of 70 mass % to 80 mass % of the glass frits and the ceramic particles to 20 mass % to 30 mass % of the vehicle, at this proportion.

The vehicle is a mixture of a resin and a solvent, and further mixed with a surfactant. The vehicle is obtained by mixing the resin, the surfactant, and the like to the solvent that is heated to 50° C. to 80° C., for example, and filtering the mixture after resting the mixture for 4 hours to 12 hours.

The resin retains the shape of a coating layer of the paste. Examples of the resin include ethyl cellulose, nitrocellulose, acrylic resin, vinyl acetate, butyral resin, melamine resin, alkyd resin, rosin resin, and the like. Ethyl cellulose, nitrocellulose, and the like may be used as a base resin. The strength of the coating layer may be improved by adding butyral resin, melamine resin, alkyd resin, or rosin resin.

The solvent has a function to dissolve the resin and to adjust the viscosity. The solvent preferably does not dry during the coating and dries quickly during the drying, and preferably has a boiling temperature of 200° C. to 230° C. Examples of the solvent include an ether type solvent (butyl carbitol (BC), butyl carbitol acetate (BCA), diethylene glycol di-n-butyl ether, dipropylene glycol butyl ether, tripropylene glycol butyl ether, butyl cellosolve acetate, an alcohol type solvent (α-terpineol, pine oil, Dowanol), an ester type solvent (2,2,4-trimethyl-1,3-pentanediol monoisobutyrate), a phthalic acid ester type solvent (DBP (dibutyl phthalate), DMP (dimethyl phthalate), DOP (dioctyl phthalate)), and the like. These solvents may be used independently or in combination in order to adjust the viscosity, the content ratio, and the drying speed. Generally, α-terpineol or 2,2,4-trimethyl-1,3-pentanediol monoisobutyrate is mainly used as the solvent. Further, DBP (dibutyl phthalate, DMP (dimethyl phthalate), and DOP (dioctyl phthalate) also function as a plasticizer.

A method of coating the paste on the translucent substrate 110 uses screen printing, doctor blade printing, dye-coat printing, and the like. It is also possible to use a method that creates a green sheet by coating the paste on a base material that is separate from the translucent substrate 110 and drying the paste, and separating the green sheet from the base material and bonding the green sheet on the translucent substrate 110 by thermocompression bonding.

In a case in which the screen printing is used, the thickness of the coating layer can be controlled by adjusting a mesh size of a screen stencil, the thickness of an emulsion, a pressing force at the time of printing, a pushing amount of a squeegee, and the like.

In a case in which the doctor blade printing or the dye-coat printing is used, the coating layer can be made thicker compared to the case in which the screen printing is used.

The coating layer may be made thicker by repeating the coating and drying.

(4) Sintering

Sintering of the coating layer of the paste includes a decomposing process to decompose and eliminate the resin within the paste, and a softening process to soften the glass frits after the decomposing process. The decomposing process is performed at atmospheric conditions for 20 minutes to 1 hour, by heating at 350° C. to 400° C. in the case in which ethyl cellulose is used for the resin, and at 200° C. to 300° C. in the case in which nitrocellulose is used for the resin. The softening process is preferably performed at atmospheric conditions for 20 minutes to 1 hour, by heating at a temperature of the glass-transition temperature Tg+70° C. to the glass-transition temperature Tg+150° C. By heating at such a temperature, the fluidity of the glass becomes high, and a part of the scattering material is unlikely to project from the surface of the glass layer even when the ceramic particles are used for the scattering material, to thereby enable a smooth surface to be formed. Even when heated at such a temperature, the glass-transition temperature Tg is sufficiently low and the crystallization uneasily occurs, and thus, a high fluidity of the glass can be obtained when compared to the conventional case, while suppressing thermal deformation of the translucent substrate 110 in a manner similar to the conventional case. By cooling to room temperature after the sintering, the scattering layer 120 is formed on the translucent substrate 110. In a case in which the fluidity of the glass is to be further increased at the softening process, the softening process is preferably performed at a temperature of the glass-transition temperature Tg+130° C. to the glass-transition temperature Tg+150° C.

Because the ceramic particles forming the filler do not project from the glass surface of the scattering layer 120, unlike the conventional case, a covering layer including glass is not provided between the scattering layer 120 and the first electrode 130. By not providing the covering layer including the glass, the warping of the translucent substrate 110 can be reduced, and the first electrode 130 and the second electrode 150 can be formed with a high accuracy.

One or more other layers may be provided between the scattering layer 120 and the first electrode 130.

EMBODIMENTS

The present invention is specifically described in the following in conjunction with embodiments, however, the present invention is not limited to the following embodiments.

Experiment 1

In Example 1 through Example 40, molten glass is created to obtain glass having compositions illustrated in Table 1 through Table 4, by combining glass raw materials such as $B_2O_3$, ZnO, $Bi_2O_3$, $SiO_2$, $Al_2O_3$, MgO, CaCO3, SrCO3, BaCO3, Ba(NO3)2, and the like, in a platinum melting pot, and heating at 1000° C. to 1200° C. for 1.5 hours. The glass raw material includes substantially no alkaline metal oxides ($Li_2O$, $Na_2O$, and $K_2O$), lead (PbO, $Pb_3O_4$), nor $P_2O_5$. Example 1 through Example 39 are embodiments, and Example 40 is a comparison example.

A part of the molten glass is poured into a carbon mold to create bulk glass. In order to remove distortions, the bulk glass is heated at 490° C. for 1 hour using an electric furnace, and thereafter annealed to room temperature using 5 hours. Samples for measuring the refractive index, and samples (cylindrical column having a diameter of 5 mm and a length of 200 mm) for measuring the glass-transition temperature and the average linear thermal expansion coefficient are created from the glass after the annealing.

The refractive index $n_d$ is measured using a refractometer (KPR-2000 manufactured by Kalnew) using the V-block method. The refractive index $n_d$ is measured at 25° C. using the d-line (wavelength: 587.6 nm) of the He lamp.

The glass-transition temperature Tg (° C.) and the average linear thermal expansion coefficient α ($10^{-7}$/° C.) are measured using a thermal expansion meter (TD5000SA manufactured by Bruker AXS). The temperature raising speed is 5° C./min. The average linear thermal expansion coefficient α is the average linear thermal expansion coefficient at 50° C. to 300° C.

The remaining part of the molten glass is poured between a pair of rolls and quenched, to create flake-shaped glass. The flake-shaped glass is broken into pieces by dry milling of a planetary ball mill for 2 hours, and particles having a particle diameter of 0.6 μm or less and particles having a particle diameter of 5.0 μm or greater are both removed using an elbow-jet classifier. The average particle diameter (D50) of the glass powder obtained is 1.5 μm when measured using a laser diffraction type particle size distribution measuring apparatus (SALD-2100 manufactured by Simadzu Corporation).

The existence of crystals at the surface of the sintered layer is observed and evaluated by coating and sintering the glass frits on the alkali silicate glass substrate (PD200 manufactured by Asahi Glass Company, Limited at an annealing temperature of 620° C.) to form the glass layer, and observing and evaluating the surface of the glass layer using an optical microscope. First, the paste is created by mixing 75 g of glass frits and 25 g of organic vehicle (10 mass % of ethyl cellulose dissolved into α-terpineol). Next, the paste is screen-printed in a range of 35 mm×35 mm on the alkali silicate glass substrate (PD200 manufactured by Asahi Glass Company, Limited) having a size of 100 mm×100 mm and a thickness of 1.8 mm, dried for 30 minutes at 150° C., once returned to room temperature and then raised to a temperature of 475° C.

in 48 minutes, and held at 475° C. for 30 minutes, in order to decompose and eliminate the resin of the organic vehicle. Thereafter, the temperature is raised to each glass-transition temperature indicated in Table 1 through Table 4 plus 130° C. (578° C. in Example 1) in 10 minutes, the temperature is held at the raised temperature (578° C. in Example 1) for 40 minutes to soften the glass, and the temperature is thereafter lowered to room temperature in 3 hours in order to form the glass layer. The thickness of the glass layer that is formed is 15 μm. Generally, for the same glass composition, the higher the sintering temperature the more easily the crystallization occurs. In addition, generally, for the same glass composition, glass powder having a particle diameter of several μm more easily crystallizes compared to glass powder having a particle diameter of several tens of μm.

Evaluation results are illustrated in Table 1 through Table 4.

TABLE 1

| | Example 1 | Example 2 | Example 3 | Example 4 | Example 5 |
|---|---|---|---|---|---|
| $B_2O_3$ (mol %) | 39.5 | 42 | 37 | 39.5 | 42.5 |
| $Bi_2O_3$ (mol %) | 21.7 | 21.7 | 21.7 | 18.7 | 21.7 |
| ZnO (mol %) | 33.8 | 33.8 | 33.8 | 36.8 | 30.8 |
| $SiO_2$ (mol %) | 5 | 2.5 | 7.5 | 5 | 5 |
| $Al_2O_3$ (mol %) | 0 | 0 | 0 | 0 | 0 |
| MgO (mol %) | 0 | 0 | 0 | 0 | 0 |
| CaO (mol %) | 0 | 0 | 0 | 0 | 0 |
| SrO (mol %) | 0 | 0 | 0 | 0 | 0 |
| BaO (mol %) | 0 | 0 | 0 | 0 | 0 |
| $CeO_2$ (mol %) | 0 | 0 | 0 | 0 | 0 |
| $MnO_2$ (mol %) | 0 | 0 | 0 | 0 | 0 |
| $SiO_2/Bi_2O_3$ | 0.23 | 0.12 | 0.35 | 0.27 | 0.23 |
| $n_d$ | 1.95 | 1.95 | 1.95 | 1.91 | 1.94 |
| $T_g$ | 448 | 444 | 446 | 454 | 453 |
| α 50-300 | 81 | 81 | 82 | 79 | 84 |
| Surface Crystallization After Sintering | None | None | None | None | None |

| | Example 6 | Example 7 | Example 8 | Example 9 | Example 10 |
|---|---|---|---|---|---|
| $B_2O_3$ (mol %) | 38.3 | 38.5 | 38.3 | 38.5 | 37.2 |
| $Bi_2O_3$ (mol %) | 21.1 | 21.2 | 18.2 | 18.2 | 20.4 |
| ZnO (mol %) | 32.8 | 33 | 35.7 | 35.9 | 31.8 |
| $SiO_2$ (mol %) | 7.8 | 4.9 | 7.8 | 4.9 | 10.6 |
| $Al_2O_3$ (mol %) | 0 | 2.4 | 0 | 2.5 | 0 |
| MgO (mol %) | 0 | 0 | 0 | 0 | 0 |
| CaO (mol %) | 0 | 0 | 0 | 0 | 0 |
| SrO (mol %) | 0 | 0 | 0 | 0 | 0 |
| BaO (mol %) | 0 | 0 | 0 | 0 | 0 |
| $CeO_2$ (mol %) | 0 | 0 | 0 | 0 | 0 |
| $MnO_2$ (mol %) | 0 | 0 | 0 | 0 | 0 |
| $SiO_2/Bi_2O_3$ | 0.37 | 0.23 | 0.43 | 0.27 | 0.52 |
| $n_d$ | 1.94 | 1.93 | 1.91 | 1.90 | 1.92 |
| $T_g$ | 453 | 453 | 461 | 459 | 458 |
| α 50-300 | 79 | 82 | 77 | 78 | 80 |
| Surface Crystallization After Sintering | None | None | None | None | None |

TABLE 2

| | Example 11 | Example 12 | Example 13 | Example 14 | Example 15 |
|---|---|---|---|---|---|
| $B_2O_3$ (mol %) | 38.5 | 38.5 | 38.5 | 41 | 40.6 |
| $Bi_2O_3$ (mol %) | 18.2 | 19.7 | 18.2 | 19.5 | 19.3 |
| ZnO (mol %) | 35.9 | 34.4 | 35.9 | 34.5 | 34.2 |
| $SiO_2$ (mol %) | 6.4 | 6.4 | 7.4 | 5 | 5.9 |
| $Al_2O_3$ (mol %) | 1 | 1 | 0 | 0 | 0 |
| MgO (mol %) | 0 | 0 | 0 | 0 | 0 |
| CaO (mol %) | 0 | 0 | 0 | 0 | 0 |
| SrO (mol %) | 0 | 0 | 0 | 0 | 0 |
| BaO (mol %) | 0 | 0 | 0 | 0 | 0 |
| $CeO_2$ (mol %) | 0 | 0 | 0 | 0 | 0 |
| $MnO_2$ (mol %) | 0 | 0 | 0 | 0 | 0 |
| $SiO_2/Bi_2O_3$ | 0.35 | 0.32 | 0.41 | 0.26 | 0.31 |
| $n_d$ | 1.91 | 1.92 | 1.91 | 1.92 | 1.92 |
| $T_g$ | 460 | 454 | 462 | 458 | 462 |
| α 50-300 | 77 | 79 | 76 | 79 | 79 |
| Surface Crystallization After Sintering | None | None | None | None | None |

| | Example 16 | Example 17 | Example 18 | Example 19 | Example 20 |
|---|---|---|---|---|---|
| $B_2O_3$ (mol %) | 34.4 | 32.4 | 29.6 | 35.4 | 26.4 |
| $Bi_2O_3$ (mol %) | 17.3 | 17.3 | 19.4 | 19.3 | 19.3 |
| ZnO (mol %) | 34.2 | 36.2 | 36.9 | 31.2 | 34.2 |
| $SiO_2$ (mol %) | 14.1 | 14.1 | 14.1 | 14.1 | 20.1 |
| $Al_2O_3$ (mol %) | 0 | 0 | 0 | 0 | 0 |
| MgO (mol %) | 0 | 0 | 0 | 0 | 0 |
| CaO (mol %) | 0 | 0 | 0 | 0 | 0 |
| SrO (mol %) | 0 | 0 | 0 | 0 | 0 |
| BaO (mol %) | 0 | 0 | 0 | 0 | 0 |
| $CeO_2$ (mol %) | 0 | 0 | 0 | 0 | 0 |
| $MnO_2$ (mol %) | 0 | 0 | 0 | 0 | 0 |
| $SiO_2/Bi_2O_3$ | 0.82 | 0.82 | 0.73 | 0.73 | 1.04 |
| $n_d$ | 1.9 | 1.9 | 1.93 | 1.91 | 1.92 |
| $T_g$ | 467 | 465 | 455 | 467 | 462 |
| α 50-300 | 71 | 73 | 76 | 73 | 72 |
| Surface Crystallization After Sintering | None | None | None | None | None |

TABLE 3

| | Example 21 | Example 22 | Example 23 | Example 24 | Example 25 |
|---|---|---|---|---|---|
| $B_2O_3$ (mol %) | 54.6 | 47.6 | 54.6 | 53.5 | 51.5 |
| $Bi_2O_3$ (mol %) | 20 | 27 | 16.5 | 31.5 | 36.1 |
| ZnO (mol %) | 25.4 | 25.4 | 28.9 | 15 | 8.6 |
| $SiO_2$ (mol %) | 0 | 0 | 0 | 0 | 3.8 |
| $Al_2O_3$ (mol %) | 0 | 0 | 0 | 0 | 0 |
| MgO (mol %) | 0 | 0 | 0 | 0 | 0 |
| CaO (mol %) | 0 | 0 | 0 | 0 | 0 |
| SrO (mol %) | 0 | 0 | 0 | 0 | 0 |
| BaO (mol %) | 0 | 0 | 0 | 0 | 0 |
| $CeO_2$ (mol %) | 0 | 0 | 0 | 0 | 0 |
| $MnO_2$ (mol %) | 0 | 0 | 0 | 0 | 0 |
| $SiO_2/Bi_2O_3$ | 0.00 | 0.00 | 0.00 | 0.00 | 0.11 |
| $n_d$ | 1.89 | 1.98 | 1.86 | 1.99 | 2.03 |
| $T_g$ | 475 | 442 | 483 | 439 | 434 |
| α 50-300 | 76 | 68 | 90 | 87 | 90 |
| Surface Crystallization After Sintering | None | None | None | None | None |

| | Example 26 | Example 27 | Example 28 | Example 29 | Example 30 |
|---|---|---|---|---|---|
| $B_2O_3$ (mol %) | 43.1 | 47.4 | 45.2 | 45.2 | 45.2 |
| $Bi_2O_3$ (mol %) | 30.1 | 10.9 | 15 | 15 | 15 |
| ZnO (mol %) | 7.4 | 36.9 | 30.6 | 30.6 | 30.6 |
| $SiO_2$ (mol %) | 19.4 | 0 | 1 | 1 | 1 |
| $Al_2O_3$ (mol %) | 0 | 4.8 | 3.6 | 3.6 | 3.6 |
| MgO (mol %) | 0 | 0 | 4.6 | 0 | 0 |
| CaO (mol %) | 0 | 0 | 0 | 4.6 | 0 |
| SrO (mol %) | 0 | 0 | 0 | 0 | 4.6 |
| BaO (mol %) | 0 | 0 | 0 | 0 | 0 |
| $CeO_2$ (mol %) | 0 | 0 | 0 | 0 | 0 |
| $MnO_2$ (mol %) | 0 | 0 | 0 | 0 | 0 |
| $SiO_2/Bi_2O_3$ | 0.64 | 0.00 | 0.07 | 0.07 | 0.07 |
| $n_d$ | 1.95 | 1.81 | 1.83 | 1.84 | 1.84 |
| $T_g$ | 450 | 494 | 485 | 481 | 476 |

TABLE 3-continued

| | | | | | |
|---|---|---|---|---|---|
| α 50-300 | 84 | 65 | 71 | 75 | 75 |
| Surface Crystallization After Sintering | None | None | None | None | None |

TABLE 4

| | Example 31 | Example 32 | Example 33 | Example 34 | Example 35 |
|---|---|---|---|---|---|
| $B_2O_3$ (mol %) | 45.2 | 40.2 | 38.8 | 39.7 | 33.8 |
| $Bi_2O_3$ (mol %) | 15 | 13.3 | 18.5 | 16.6 | 20.1 |
| ZnO (mol %) | 30.6 | 42.5 | 32.7 | 25.4 | 24.9 |
| $SiO_2$ (mol %) | 1 | 0.8 | 5.6 | 5.8 | 8.7 |
| $Al_2O_3$ (mol %) | 3.6 | 3.2 | 0 | 0 | 0 |
| MgO (mol %) | 0 | 0 | 0 | 0 | 0 |
| CaO (mol %) | 0 | 0 | 0 | 0 | 0 |
| SrO (mol %) | 0 | 0 | 0 | 0 | 0 |
| BaO (mol %) | 4.6 | 0 | 4.4 | 12.5 | 12.5 |
| $CeO_2$ (mol %) | 0 | 0 | 0 | 0 | 0 |
| $MnO_2$ (mol %) | 0 | 0 | 0 | 0 | 0 |
| $SiO_2/Bi_2O_3$ | 0.07 | 0.06 | 0.30 | 0.35 | 0.43 |
| $n_d$ | 1.84 | 1.84 | 1.92 | 1.93 | 1.93 |
| $T_g$ | 474 | 476 | 458 | 458 | 442 |
| α 50-300 | 76 | 70 | 80 | 86 | 94 |
| Surface Crystallization After Sintering | None | None | None | None | None |

| | Example 36 | Example 37 | Example 38 | Example 39 | Example 40 |
|---|---|---|---|---|---|
| $B_2O_3$ (mol %) | 34.1 | 34.1 | 38.1 | 38.8 | 30.5 |
| $Bi_2O_3$ (mol %) | 18.6 | 18.6 | 18.6 | 28 | 8.8 |
| ZnO (mol %) | 26.3 | 30.3 | 26.3 | 17.4 | 33 |
| $SiO_2$ (mol %) | 8.7 | 8.7 | 8.7 | 11.4 | 15 |
| $Al_2O_3$ (mol %) | 0 | 0 | 0 | 0 | 0 |
| MgO (mol %) | 0 | 0 | 0 | 0 | 0 |
| CaO (mol %) | 0 | 0 | 0 | 0 | 0 |
| SrO (mol %) | 0 | 0 | 0 | 0 | 0 |
| BaO (mol %) | 12.3 | 8.3 | 8.3 | 4.4 | 11 |
| $CeO_2$ (mol %) | 0 | 0 | 0 | 0 | 0.1 |
| $MnO_2$ (mol %) | 0 | 0 | 0 | 0 | 0.1 |
| $SiO_2/Bi_2O_3$ | 0.47 | 0.47 | 0.47 | 0.41 | 1.70 |
| $n_d$ | 1.91 | 1.91 | 1.90 | 2.00 | 1.72 |
| $T_g$ | 447 | 452 | 459 | 437 | 493 |
| α 50-300 | 90 | 85 | 85 | 90 | 79 |
| Surface Crystallization After Sintering | None | None | None | None | None |

From Table 1 through Table 4, it is confirmed that the glass in each of Example 1 through Example 39 has a high refractive index, softening property at low temperatures, and a low coefficient of thermal expansion. In addition, no crystals are observed at the surface of the glass layer formed by the sintered layer for the glass in each of Example 1 through Example 39. Accordingly, the scattering layer including the glass in each of Example 1 through Example 39 is suited for forming electrodes.

Experiment 2

In Example 41 through Example 46, the paste is coated and sintered on the alkali silicate glass substrate to form the scattering layer (thickness of 15 μm), in a manner similar to Example 15, except that a part of the glass frits is replaced by the fillers illustrated in Table 5 when creating the paste, and the surface of the scattering layer is observed using an optical microscope and an electron microscope in order to check whether the filler is exposed at the surface of the scattering layer.

In Example 47 and Example 48, the paste is coated and sintered on the alkali silicate glass substrate to form the scattering layer (thickness of 15 μm), in a manner similar to Example 36, except that a part of the glass frits is replaced by the fillers illustrated in Table 5 when creating the paste, and the surface of the scattering layer is observed using an optical microscope and an electron microscope in order to check whether the filler is exposed at the surface of the scattering layer.

In Example 49, the paste is coated and sintered on the alkali silicate glass substrate to form the scattering layer (thickness of 15 μm), in a manner similar to Example 40, except that a part of the glass frits is replaced by the fillers illustrated in Table 5 when creating the paste, and the surface of the scattering layer is observed using an optical microscope and an electron microscope in order to check whether the filler is exposed at the surface of the scattering layer.

Evaluation results are illustrated in Table 6. In Table 6, "Ratio" indicates a ratio (volume %) of the filler occupying the scattering layer. In addition, in Table 6, "Glass A" indicates the glass having the composition of Example 15, and "Glass B" indicates the glass having the composition of Example 36, and "Glass C" indicates the glass having the composition of Example 40. Example 41 through Example 48 are embodiments, and Example 49 is a comparison example.

TABLE 5

| Filler | $SiO_2$ | $ZrO_2$ | $TiO_2$ | $Al_2O_3$ |
|---|---|---|---|---|
| $n_d$ | 1.5 | 2.2 | 2.7 | 1.7 |
| Average Particle Diameter D50 (μm) | 0.82 | 0.61 | 0.84 | 0.66 |

TABLE 6

| | Example 41 | Example 42 | Example 43 | Example 44 | Example 45 |
|---|---|---|---|---|---|
| Base Material Glass | Glass A | Glass A | Glass A | Glass A | Glass A |
| Filler | $SiO_2$ | $SiO_2$ | $ZrO_2$ | $ZrO_2$ | $TiO_2$ |
| Ratio (Volume %) | 3 | 5 | 3 | 7 | 3 |
| Filler Exposure at Sintering Layer Surface | None | None | None | None | None |

| | Example 46 | Example 47 | Example 48 | Example 49 |
|---|---|---|---|---|
| Base Material Glass | Glass A | Glass B | Glass B | Glass C |
| Filler | $TiO_2$ | $ZrO_2$ | $Al_2O_3$ | $ZrO_2$ |
| Ratio (Volume %) | 5 | 7 | 5 | 5 |
| Filler Exposure at Sintering Layer Surface | None | None | None | Yes |

From Table 6, it is confirmed that the scattering layer in each of Example 41 through Example 48 includes no filler exposed at the surface of the scattering layer, and that the electrodes of the organic LED element can be formed without providing a covering layer, including glass, between the scattering layer and the electrode. On the other hand, it is confirmed that the scattering layer of Example 49 includes the filler exposed at the surface of the scattering layer, and that a short-circuit may be generated between the electrodes when the organic LED is formed without providing the covering layer.

According to the embodiments and examples thereof, a laminated substrate for the organic LED element, and an organic LED element are provided, that can suppress exposure of a filler at a surface of a scattering layer in a case in which a solid scattering material (filler) is used, and does not require a covering layer including glass to be provided between the scattering layer and electrode.

The embodiments and examples are suited for the laminated substrate for the organic LED element, and the organic LED element.

Although the examples are numbered with, for example, "1," "2," "3," . . . , the ordinal numbers do not imply priorities of the examples. Many other variations and modifications will be apparent to those skilled in the art.

What is claimed is:

1. A laminated substrate, comprising:
    a translucent substrate;
    a scattering layer, which comprises glass and a solid scattering material, on the translucent substrate and having a thickness of 30 µm or less; and
    an electrode on the scattering layer,
    wherein no covering layer comprising glass is between the scattering layer and the electrode, and
    wherein the glass of the scattering layer comprises, as represented by mol percentage based on the following oxides,
        15% to 60% of $B_2O_3$, 20% to 45% of ZnO, 5% to 37% of $Bi_2O_3$, 2 to 14% of $SiO_2$, 0 to 15% of $Al_2O_3$, a total of 0 to 20% of alkaline earth metal oxides, comprising substantially no alkali metal oxide, wherein a $SiO_2/Bi_2O_3$ value obtained by dividing $SiO_2$-content by $Bi_2O_3$-content is less than 1.1.

2. The laminated substrate as claimed in claim 1, wherein the solid scattering material is one of silica, alumina, titania, and zirconia.

3. The laminated substrate as claimed in claim 1, wherein an average particle diameter of the solid scattering material is from 100 nm to 900 nm.

4. The laminated substrate as claimed in claim 1, wherein the solid scattering material is one of silica, alumina, titania, and zirconia.

5. The laminated substrate as claimed in claim 1, wherein the glass of the scattering layer does not comprise $P_2O_5$.

6. The laminated substrate as claimed in claim 1, wherein the glass of the scattering layer comprises from 1 to 15 mol % of $Al_2O_3$.

7. The laminated substrate as claimed in claim 1, wherein the glass of the scattering layer does not comprise any alkali metal oxide.

8. The laminated substrate as claimed in claim 1, wherein the glass of the scattering layer comprises from 25 to 40 mol % of ZnO.

9. An organic LED element comprising:
    a translucent substrate;
    a scattering layer, which comprises glass and a solid scattering material, on the translucent substrate and having a thickness of 30 µm or less;
    a first electrode on the scattering layer;
    an organic layer on the first electrode; and
    a second electrode on the organic layer,
    wherein no covering layer comprising glass is between the scattering layer and the first electrode, and
    wherein the glass of the scattering layer comprises, as represented by mol percentage based on the following oxides,
        15% to 60% of $B_2O_3$, 20% to 45% of ZnO, 5% to 37% of $Bi_2O_3$, 2 to 14% of $SiO_2$, 0 to 15% of $Al_2O_3$, a total of 0 to 20% of alkaline earth metal oxides, comprising substantially no alkali metal oxide, wherein a $SiO_2/Bi_2O_3$ value obtained by dividing $SiO_2$-content by $Bi_2O_3$-content is less than 1.1.

10. The organic LED element as claimed in claim 9, wherein the solid scattering material is one of silica, alumina, titania, and zirconia.

* * * * *